(12) United States Patent
Lee et al.

(10) Patent No.: US 8,039,643 B2
(45) Date of Patent: Oct. 18, 2011

(54) ORGANIC MEMORY DEVICE USING IRIDIUM ORGANOMETALLIC COMPOUND AND FABRICATION METHOD THEREOF

(75) Inventors: Kwang Hee Lee, Yongin-si (KR); Yi Yeol Lyu, Yongin-si (KR); Sang Kyun Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/805,431

(22) Filed: Jul. 30, 2010

(65) Prior Publication Data

US 2010/0301323 A1  Dec. 2, 2010

Related U.S. Application Data

(62) Division of application No. 11/783,138, filed on Apr. 6, 2007.

(30) Foreign Application Priority Data

Dec. 18, 2006 (KR) .................. 10-2006-0129296

(51) Int. Cl.
*C07F 15/00* (2006.01)
*H01L 51/00* (2006.01)

(52) U.S. Cl. ....... 549/3; 549/211; 313/504; 252/301.18; 428/690

(58) Field of Classification Search .......... 546/2; 549/3, 549/211; 428/690; 313/504; 252/301.18
See application file for complete search history.

(56) References Cited

U.S. PATENT DOCUMENTS

| 6,872,474 B2 | 3/2005 | Sakakibara et al. |
| 2002/0163057 A1 | 11/2002 | Bulovic et al. |
| 2004/0027849 A1 | 2/2004 | Yang et al. |

FOREIGN PATENT DOCUMENTS

| JP | 62-95882 | 5/1987 |
| JP | 2003/253145 | 9/2003 |
| JP | 2003253129 A * | 9/2003 |

* cited by examiner

*Primary Examiner* — Charanjit Aulakh
(74) *Attorney, Agent, or Firm* — Harness, Dickey & Pierce, P.L.C.

(57) ABSTRACT

Disclosed are a composition comprising a mixture of at least one iridium organometallic compound and an electrically conductive polymer, an organic active layer comprising the same, an organic memory device comprising the organic active layer and methods for fabricating the same. The organic memory device may include a first electrode, a second electrode and the organic active layer between the first and second electrodes. The organic memory device possesses the advantages of rapid switching time, decreased operating voltage, decreased fabrication costs, increased reliability and improved non-volatility.

20 Claims, 3 Drawing Sheets

ORGANIC MEMORY DEVICE USING IRIDIUM ORGANOMETALLIC COMPOUND AND FABRICATION METHOD THEREOF

PRIORITY STATEMENT

This U.S. nonprovisional application is a divisional of U.S. application Ser. No. 11/783,138, filed Apr. 6, 2007, which claims priority under 35 U.S.C. §119 to Korean Patent Application No. 2006-129296, filed on Dec. 18, 2006, in the Korean Intellectual Property Office (KIPO), the entire contents of each of which are incorporated herein by reference.

BACKGROUND

1. Field

Example embodiments include a composition comprising a mixture of at least one iridium organometallic compound and an electrically conductive polymer, an organic active layer comprising the same, an organic memory device comprising the organic active layer and methods for fabricating the same. Other example embodiments include a composition comprising a mixture of at least one iridium organometallic compound and an electrically conductive polymer, an organic active layer comprising the same, an organic memory device comprising the organic active layer with improved operating characteristics and improved non-volatility, which comprises a first electrode, a second electrode and the organic active layer between the first and second electrodes, and methods for fabricating the same.

2. Description of the Related Art

With the recent developments in digital communication technology, demand for a variety of memory devices has been increasing. For example, portable electronic devices suitable for use in applications including, for example, mobile terminals, smart cards, electronic money, digital cameras, personal digital assistants, digital audio players, multimedia players and others, are required for retaining data in memory even when no power is being applied to the memory device, thereby tending to reduce the memory-related power consumption of the device.

In view of the known limitations of conventional flash memory devices and the processes for fabricating such devices, efforts have continued toward developing next-generation nonvolatile memory devices that overcome at least certain of the limitations associated with conventional silicon-based memory devices and provide one or more advantages over the conventional devices including, for example, increased operating speeds, increased density and/or capacity, reduced power consumption and/or reduced fabrication costs.

Some of these next-generation memories may be generally categorized as, for example, ferroelectric RAMs, magnetic RAMs, phase change RAMs, nanotube memories, holographic memories, organic memories, and/or other groupings that tend to reflect the particular constituent materials used in forming the primary memory cells, and/or the particular configuration of the materials and/or structures within the memory cells utilized in the semiconductor memory devices.

Organic memories, for example, may include an organic active layer formed from an organic material positioned between an upper electrode and a lower electrode to utilize the bistability of resistance values obtained when a voltage may be applied to the devices for storing data. Such organic memories have attracted attention as next-generation memories because they provide the desired non-volatility, which may be an advantage associated with conventional flash memories, while also providing improved processability, reducing fabrication costs and/or improving the degree of integration.

Examples of such an organic memory may utilize a 7,7,8,8-tetracyano-p-quinodimethane (CuTCNQ), which may be an organometallic charge transfer complex compound, as the organic material. Another example includes semiconductor devices comprising an upper electrode, a lower electrode and an intermediate layer between the upper and lower electrodes, wherein the intermediate layer may be formed from a mixture of an ionic salt (e.g., NaCl or CsCl) and a conductive polymer. Other work has suggested organic memory devices comprising organic active layers and a metal nanocluster applied between the organic active layers, but efforts in this area have been hampered by low yields, difficulties in forming suitable metal nanoclusters, and reset voltages of about 0 V, rendering such devices generally unsuitable for widespread use as a nonvolatile organic memory.

SUMMARY

Example embodiments are provided below for addressing certain of the deficiencies and/or limitations of the conventional art memory devices through the manufacture and use of organic memory devices that incorporate an iridium organometallic compound that provide one or more advantages over the conventional devices including, for example, rapid switching time, decreased operating voltage, decreased fabrication costs, increased reliability and improved non-volatility. Example embodiments of methods which may be used to fabricate such devices using less complicated and/or less expensive fabrication processes including, for example, spin coating or spin casting, are also provided.

In accordance with example embodiments, a composition may include a mixture of an electrically conductive polymer and at least one iridium organometallic compound selected from compounds of Formulae 1 to 3:

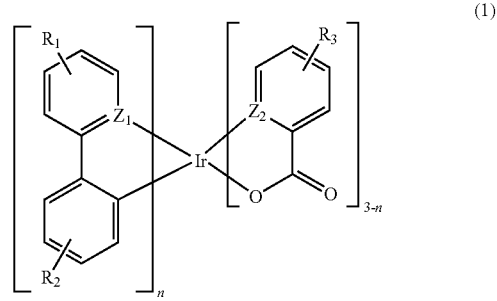

(1)

wherein $R_1$, $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3;

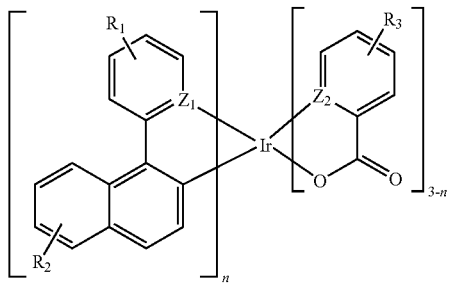

(2)

wherein $R_1$, $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3; and

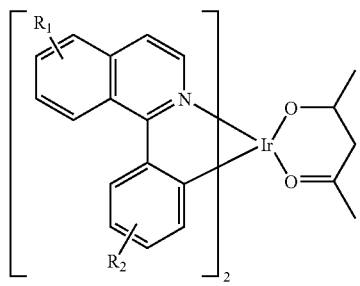

(3)

wherein $R_1$ and $R_2$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group.

Example embodiments of such materials will typically exhibit a maximum emission wavelength of about 450 nm to about 550 nm, for example, about 480 nm to about 530 nm.

Iridium organometallic compounds that may be represented by Formula 1 may include compounds of Formulae 4 and 5:

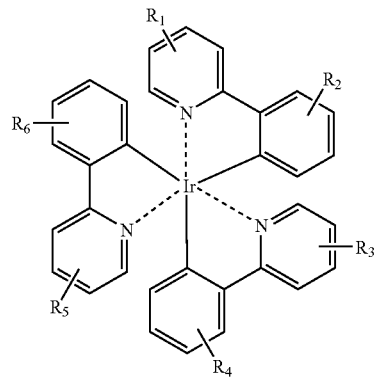

(4)

wherein $R_1$ through $R_6$, which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$-heterocycloalkyl group, a $C_6$-$C_{30}$ aryl group, a $C_4$-$C_{30}$ heteroaryl group, a $C_7$-$C_{30}$ arylalkyl group, or a $C_6$-$C_{30}$ aryloxy group; and

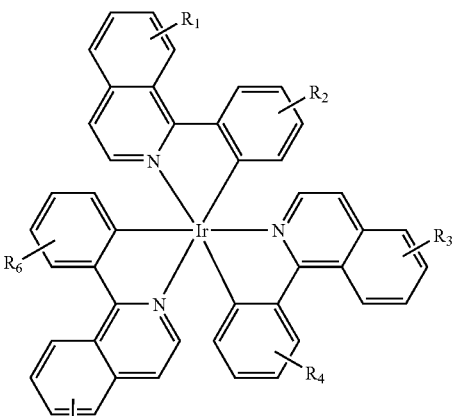

(5)

wherein $R_1$ through $R_6$ are as defined in Formula 4.

The electrically conductive polymer may be at least one polymer selected from the group consisting of polythiophene, polyacetylene, polyporphyrin, polyvinylcarbazole, polyaniline, polypyrrole, polyphenylenevinylene, polyfluorene, poly(3-hexylthiophene), polynaphthalene, poly(p-phenylene sulfide), polyvinylpyridine, polyferrocene and polystyrol, but may not be necessarily limited thereto.

In accordance with example embodiments, an organic active layer may include the composition of example embodiments. In accordance with other example embodiments, an organic memory device may include a first electrode, a second electrode and the organic active layer of example embodiments between the first and second electrodes.

In accordance with example embodiments, a method for fabricating an organic active layer may include forming the organic active layer using at least one iridium organometallic compound selected from compounds of Formulae 1 to 3:

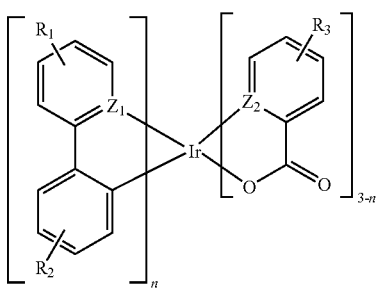

(1)

wherein $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3;

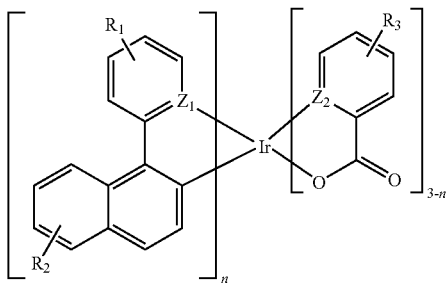

(2)

wherein $R_1$, $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3; and

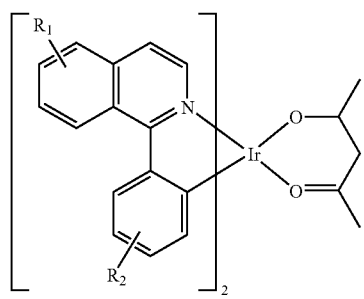

(3)

wherein $R_1$ and $R_2$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group.

In accordance with example embodiments, a method for fabricating an organic memory device may include forming a first electrode and a second electrode, and forming the organic active layer of example embodiments between the first and second electrodes.

BRIEF DESCRIPTION OF THE DRAWINGS

Example embodiments will be more clearly understood from the following detailed description taken in conjunction with the accompanying drawings.

FIG. 1 is a cross-sectional view of an organic memory device (or memory cells) according to example embodiments;

FIG. 2 is a perspective view of a memory matrix employing a memory device according to example embodiments;

FIG. 3 is a current-voltage curve showing the memory properties of a memory device fabricated in Example 1;

FIG. 4 is a graph showing changes in the resistance of an organic memory device fabricated in Example 1 in set and reset states with the passage of time; and FIG. 5 is a graph showing switching cycles of an organic memory device fabricated in Example 1.

Figure 1:
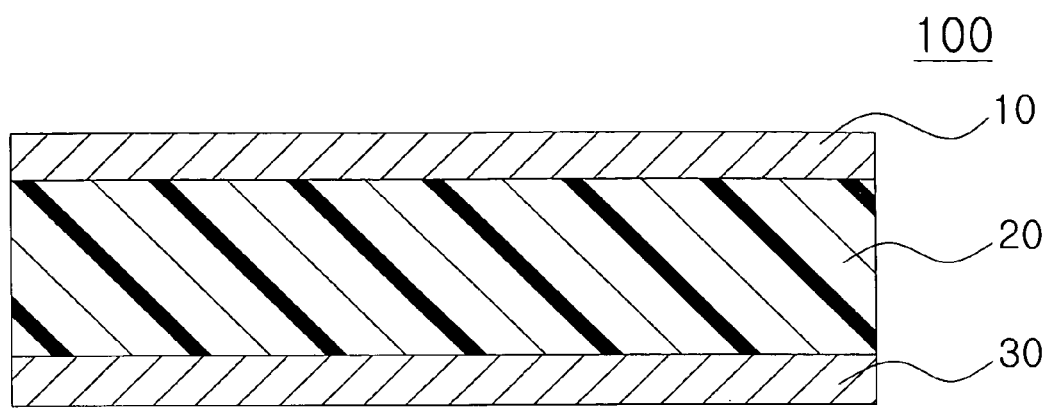
FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DESCRIPTION OF EXAMPLE EMBODIMENTS

Example embodiments will now be described in greater detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "organic memory device" generally describes a memory device comprising a first electrode, a second electrode and an organic active layer between the first and second electrodes that may be operated to store data by inducing changes in the resistance of the organic active layer associated with the formation and dissolution, attenuation or removal of metal filaments within the organic active layer. In example embodiments of such organic memory devices, the organic active layer may be formed from a mixture of an electrically conductive polymer and at least one iridium organometallic compound selected from compounds of Formulae 1 to 3:

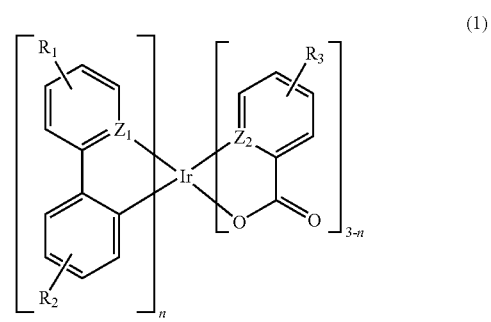

(1)

wherein $R_1$, $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3;

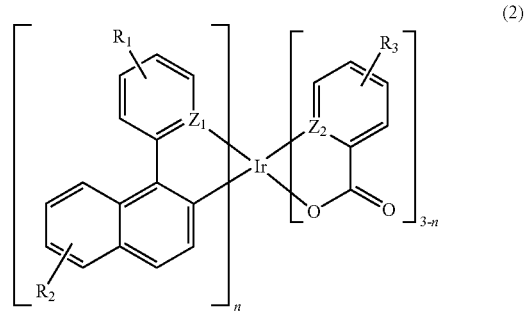

(2)

wherein $R_1$, $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ het eroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3; and

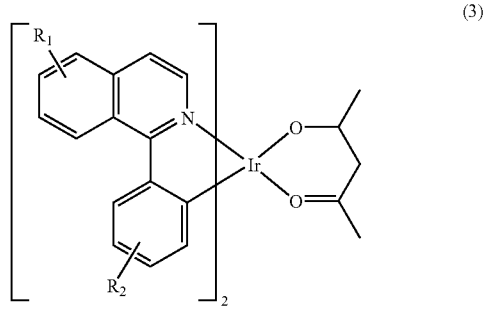

(3)

wherein $R_1$ and $R_2$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group.

FIG. 1 is a cross-sectional view of an organic memory device according to example embodiments. With reference to FIG. 1, the organic memory device 100 of example embodiments may include a first electrode 10, a second electrode 30 and an organic active layer 20 between the first and second electrodes 10 and 30. The resistance values of the organic active layer 20 obtained when a voltage is applied to the memory device 100 may exhibit bistability, the organic active layer can exhibit two distinct stable conductivity states at the same applied voltage, which may be utilized as the memory characteristics of the memory device.

The iridium organometallic compound of Formula 1 may be a transition metal compound containing iridium as a transition metal and organic ligands bound to the transition metal, and may have two or more stable redox states depending on the difference in oxidation/reduction potential. Because the electrically conductive polymer maintains its inherent conductivity and molecules of the iridium organometallic compound distributed adjacent to the electrically conductive polymer' have different redox states, the organic active layer may have two or more different bistable conductivity states, thus allowing the organic device to exhibit memory characteristics. For example, when a proper electrical voltage is applied between the two electrodes of the organic memory device according to example embodiments, the organic active layer may switch between a higher resistance state and a lower resistance state depending on the redox states of the iridium organometallic compound. Assuming that the lower resistance state is defined as data "1" and the higher resistance state is defined as data "0", two logic states of the data may be stored.

Because the redox states of the iridium organometallic compound are stable, the organic memory device of example embodiments may be highly stable and reproducible. The oxidation state of the organic active layer, which may be formed of a mixture of the iridium organometallic compound and the electrically conductive polymer, may be maintained unchanged until another voltage is applied to the organic active layer. Further, because the oxidation state is maintained even when no power is being applied to the memory device, the organic memory device of example embodiments may exhibit improved non-volatility. Because the iridium organometallic compound has a low molecular weight and is soluble, less complicated and/or less expensive fabrication processes including, for example, spin coating or spin casting, may be employed to form the organic active layer of the organic memory device.

The aromatic rings of the iridium organometallic compound may have one or more substituents (e.g. $R_1$ to $R_3$ or $R_1$ and $R_2$). The substituents $R_1$ to $R_3$ or $R_1$ and $R_2$ may be identical to or different from each other, and non-limiting examples thereof may include H, substituted and unsubstituted $C_1$-$C_{20}$ alkyl groups, substituted and unsubstituted alkoxy groups, substituted and unsubstituted $C_3$-$C_{20}$ cycloalkyl groups, substituted and unsubstituted $C_3$-$C_{20}$ heterocycloalkyl groups, substituted and unsubstituted $C_6$-$C_{30}$ aryl groups, substituted and unsubstituted $C_4$-$C_{30}$ heteroaryl groups, substituted and unsubstituted $C_7$-$C_{30}$ arylalkyl groups and substituted and unsubstituted $C_6$-$C_{30}$ aryloxy groups. The alkyl may be straight-chained or branched, and specific examples thereof may include methyl, ethyl, propyl, isobutyl, sec-butyl, sec-butyl, pentyl, iso-amyl and hexyl.

The alkoxy may be a functional group formed by removing a proton from a hydroxyl group of an alcohol. The alkoxy group may be represented by —OR wherein R may be a monovalent hydrocarbon group selected from $C_1$-$C_{20}$ alkyl, alkenyl, aryl and arylalkyl groups.

The term "cycloalkyl" as used herein refers to a $C_3$-$C_{30}$ monovalent monocyclic system. At least one hydrogen atom contained in the cycloalkyl group may be substituted.

The term "heterocycloalkyl" as used herein refers to a $C_3$-$C_{20}$ monovalent monocyclic system consisting of one to three heteroatoms selected from N, O, P and S atoms and the remaining ring carbon atoms. At least one hydrogen atom contained in the heterocycloalkyl group may be substituted.

The term "aryl" as used herein refers to a carbocyclic aromatic system including one or more aromatic rings in which the rings may be attached together in a pendent manner or may be fused. Specific examples of the aryl group may include aromatic groups, e.g., phenyl, naphthyl, and tetrahydronaphthyl. At least one hydrogen atom contained in the aryl group may be substituted.

The term "heteroaryl" as used herein refers to a $C_4$-$C_{30}$ cyclic aromatic system consisting of one to three heteroatoms selected from N, O, P and S atoms and the remaining ring carbon atoms in which the rings may be attached together in a pendant manner or may be fused. At least one hydrogen atom contained in the heteroaryl group may be substituted.

The term "arylalkyl" as used herein refers to a group in which a part of hydrogen atoms contained in the aryl group defined above are substituted with lower alkyl radicals, e.g., methyl, ethyl and propyl. Examples of the arylalkyl group may include benzyl and phenylethyl. At least one hydrogen atom contained in the arylalkyl group may be substituted.

The aryloxy may contain about 6 to about 30 carbon atoms. Specific examples of the aryloxy group may include phenyloxy, naphthyloxy and/or anthryloxy. Examples of suitable substituents may include, but may not be necessarily limited to, $C_1$-$C_{20}$ alkyl (for example, $C_1$-$C_{12}$ alkyl), alkyloxy, aryl, aryloxy, hydroxyl, hydroxyalkyl, amino, aminoalkyl and/or halogen groups.

Examples of iridium organometallic compounds that may be represented by Formula 1 may include compounds of Formulae 4 and 5:

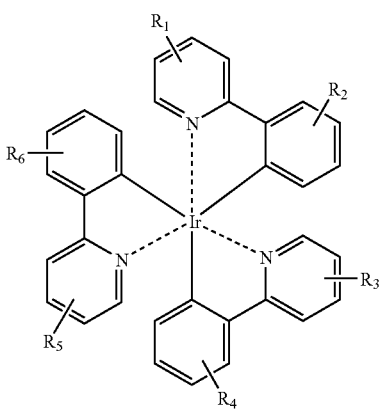

(4)

wherein $R_1$ through $R_6$, which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_6$-$C_{30}$ aryl group, a $C_4$-$C_{30}$ heteroaryl group, a $C_7$-$C_{30}$ arylalkyl group, or a $C_6$-$C_{30}$ aryloxy group; and

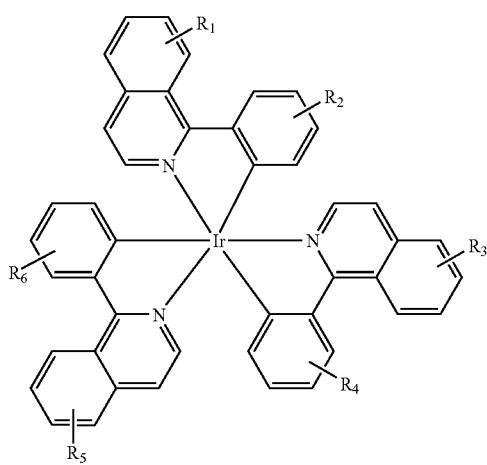

(5)

wherein $R_1$ through $R_6$ are as defined in Formula 4.

These iridium organometallic compounds that may be used in example embodiments may have—a maximum emission wavelength of about 450 nm to about 550 nm, for example, about 480 nm to about 530 nm.

The electrically conductive polymer may be at least one polymer selected from the group consisting of polythiophene, polyacetylene, polyporphyrin, polyvinylcarbazole, polyaniline, polypyrrole, polyphenylenevinylene, polyfluorene, poly(3-hexylthiophene), polynaphthalene, poly(p-phenylene sulfide), polyvinylpyridine, polyferrocene, and polystyrol. Specific examples of such electrically conductive polymers may include, but may not be necessarily limited to, poly(3-hexylthiophene-2,5-diyl), poly(9-vinylcarbazole), polyaniline (emeraldine base), poly[2-methoxy-5-(2-ethylhexyloxy)-1,4-phenylenevinylene], and poly(9,9-didodecylfluorenyl-2,7-yleneethynylene).

Figure 2:
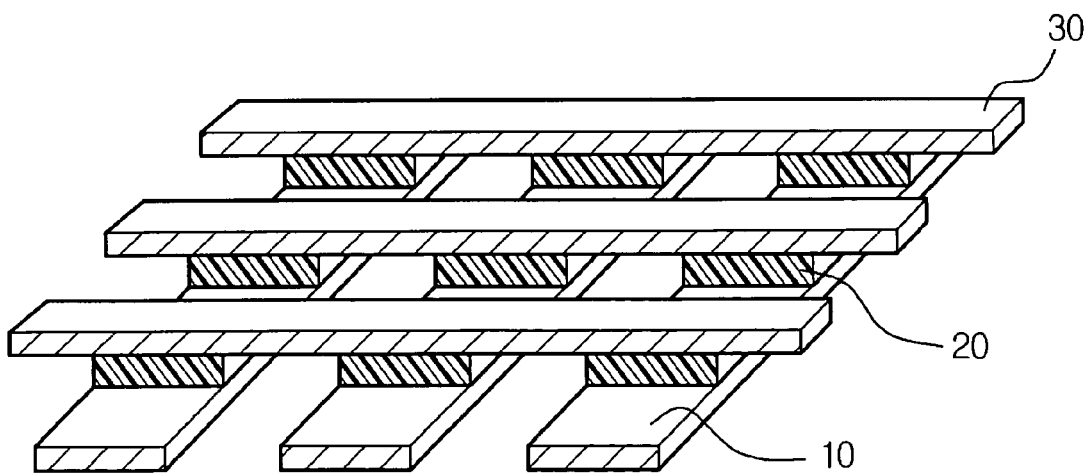

FIG. 2 is a perspective view of an exemplary memory matrix employing the memory device of example embodiments. The memory matrix may be formed on a suitable substrate (not shown). As shown in FIG. 2, a plurality of memory cells, which may be formed at respective intersections between first electrodes 10 and second electrodes 30, provide bistability characteristics.

As the substrate, a common organic or inorganic substrate, for example, a flexible substrate, may be used. Examples of suitable materials for the substrate may include, but need not be limited to, glass, silicon, surface-modified glass, polypropylene, activated acrylamide ceramics, membranes, gels, and aerogels.

The first electrodes 10 and the second electrodes 30 may be made of at least one electrically conductive material selected from the group consisting of metals, metal alloys, metal nitrides, metal oxides, metal sulfides, organic conductors, nanostructures, and crystals. Specific examples of materials for the first and second electrodes may include, but need not be limited to, gold, silver, platinum, copper, cobalt, nickel, tin, titanium, tungsten, aluminum, and indium tin oxide (ITO).

The organic memory device of example embodiments may further include a barrier layer formed on the first electrode or under the second electrode to protect the organic active layer from being damaged before the overlying second electrode may be formed. The barrier layer may be formed of a material selected from the group consisting of LiF, $SiO_x$, $AlO_x$, $NbO_x$, $TiO_x$, $CrO_x$, $VO_x$, $TaO_x$, $CuO_x$, $MgO_x$, $WO_x$ and $AlNO_x$, and may be formed of a material selected from the group consisting of $SiO_2$, $Al_2O_3$, $Cu_2O$, $TiO_2$ and $V_2O_3$. The barrier layer may also be formed of an organic material selected from Alq3, polymethylmethacrylate, polystyrene and PET. The thickness of the barrier layer may be in the range of about 20 Å to about 300 Å.

The organic memory device of example embodiments may be well suited for use in electronic devices, e.g., computers, portable information devices, medical devices, radar devices and/or satellite devices. Because the organic memory device of example embodiments may be reduced in size and weight, example embodiments may be used to improve the portability of portable digital devices, including cell phones, PDAs, notebook computers, digital cameras, portable multimedia players, and/or DMB terminals.

Example embodiments are directed to a method for fabricating an organic memory device using an iridium organometallic compound. An organic memory device fabricated by the method of example embodiments may include a first electrode, a second electrode and an organic active layer between the first and second electrodes, wherein the organic active layer may be formed of a mixture of an electrically conductive polymer and at least one iridium organometallic compound selected from compounds of Formulae 1 to 3:

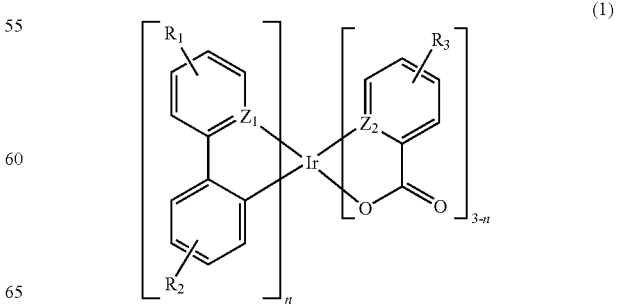

(1)

wherein $R_1$, $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3;

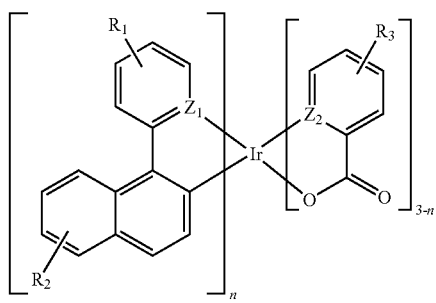

(2)

wherein $R_1$, $R_2$ and $R_3$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which may be identical to or different from each other, are independently O, N or S, and n is an integer from about 1 to about 3; and

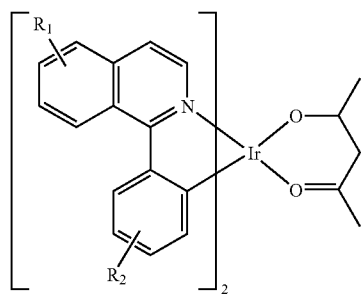

(3)

wherein $R_1$ and $R_2$, which may be identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group.

According to the method of example embodiments, the organic active layer may be formed by a simpler process, for example, by one-time spin coating and/or spin casting of the electrically conductive polymer, which may be an electron-rich conjugated organic polymer, and the iridium organometallic compound. Materials for a substrate, the electrodes and the organic active layer are the same as those explained above.

According to the method of example embodiments, an organic memory device may be fabricated by forming a first electrode (a lower electrode) on a substrate, applying a coating solution of the iridium-containing compound and the electrically conductive polymer to the first electrode, drying the coating solution to form an organic active layer, and forming a second electrode (an upper electrode) on a pattern of the organic active layer to form memory cells at intersections between the first electrode and the second electrode.

Processes for the formation of the organic active layer using the iridium organometallic compound and the electrically conductive polymer may not be particularly limited, and examples thereof may include spin coating, spray coating, electrostatic coating, dip coating, blade coating, roll coating, and inkjet printing. The organic active layer may have a thickness of about 50 Å to about 3,000 Å.

Any solvent that may dissolve the iridium organometallic compound and the electrically conductive polymer may be used for spin coating. At least one solvent selected from the group consisting of chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile and mixtures thereof may be used to form the organic active layer by spin coating. A solvent system or solvent mixture of two or more of these solvents in any miscible ratio may also be used.

Baking may be performed after the coating. Baking processes may be suitably selected according to the solvent used. Taking into consideration the boiling point of the coating solvent used, the baking may be performed on a hot plate for about 10 minutes or more.

The first and second electrodes may be made by known processes, including deposition (e.g., thermal evaporation), sputtering, e-beam evaporation and spin coating.

Hereinafter, example embodiments will be explained in more detail with reference to the following examples. However, these examples are given for the purpose of illustration and are not to be construed as limiting the scope of example embodiments.

EXAMPLES

Example 1

An ITO-deposited glass substrate (Corning 1737) was cut to a size 5 cm×5 cm and patterned by photolithography/wet etching. The patterned substrate was dipped in acetone/isopropyl alcohol, ultrasonicated for about 15 minutes, and dried.

About 10 mg of poly(9-vinylcarbazole), which may be a electrically conductive polymer commercially available from Aldrich under the Product No. 368350 and about 1 mg of an iridium organometallic compound of Formula 2 (wherein $R_1$, $R_2$, $R_3$, $R_4$, $R_5$ and $R_6$ are all hydrogen atoms), which may be commercially available from American Dye Source Inc. under the product No. ADS 060 GE, were dissolved in about 1 ml of cyclohexanone by sonication for about 30 minutes. The solution was passed through a PTFE syringe filter (pore size: about 0.2 μm) and spin-coated at about 2,000 rpm on the ITO/glass substrate for about 30 seconds. The remaining solvent was removed by baking the coated substrate on a hot plate at about 150° C. for about 20 minutes to form an organic active layer. During fabrication of this test memory device, the organic active layer thus formed had a thickness of about 50 nm to about 100 nm, as measured using an Alpha-Step profilometer.

A shadow mask was placed on the resulting substrate and introduced into a thermal evaporator. LiF was deposited to a thickness of about 5 nm on the organic active layer to form a barrier layer, and thereafter, Al was deposited to a thickness of about 80 nm on the barrier layer by thermal evaporation to form an upper electrode, completing the fabrication of an organic memory device according to example embodiments. The thicknesses of the electrodes were controlled using a quartz crystal monitor.

Test Example 1

Test for Characteristics of Memory Device

Figure 3:
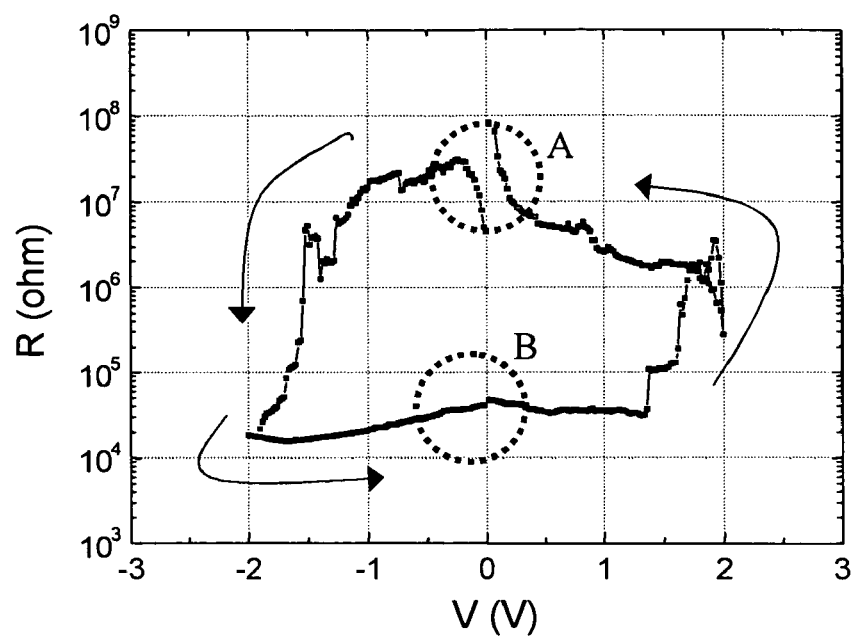

The electrical properties of the memory device fabricated in Example 1 were evaluated using a semiconductor characterization system (S4200, Keithley). After a voltage was applied to the electrodes facing each other, the switching properties of the memory device were evaluated as variations in current. The results are shown in FIG. 3. Variations in two different resistance states of the organic memory device were measured as a function of time, and the results are shown in FIG. 4.

Referring to FIG. 3, the memory device showed two conductive states when a maximum voltage of about 2 V was swept in both positive (+) and negative (−) directions. Where sweeping included the application of a positive voltage, the memory device was switched into a higher resistance state (a reset state, denoted by 'A' in FIG. 3) of about 1.5 V. Meanwhile, where a negative bias voltage was applied, the memory device was switched into a lower resistance state (a set state, denoted by 'B' in FIG. 3) of about −1.5 V.

Figure 4:
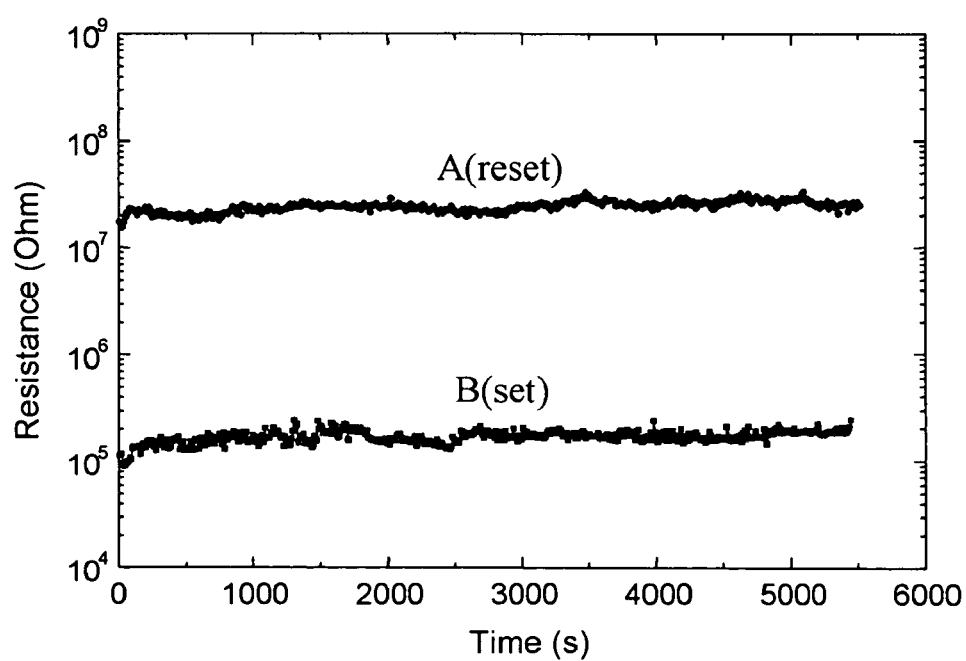

FIG. 4 is a graph showing changes in the resistance of the organic memory device fabricated in Example 1 in set and reset states with the passage of time. After a voltage of about 0.2 V much lower than a threshold voltage was applied to the organic memory device in the respective resistance states, changes in resistance were measured at an interval of about 10 seconds. As a result, the resistance values were maintained without any change for about 90 minutes or longer in the set and reset states. These results lead to the conclusion that the organic memory device of example embodiments had improved non-volatility.

Figure 5:
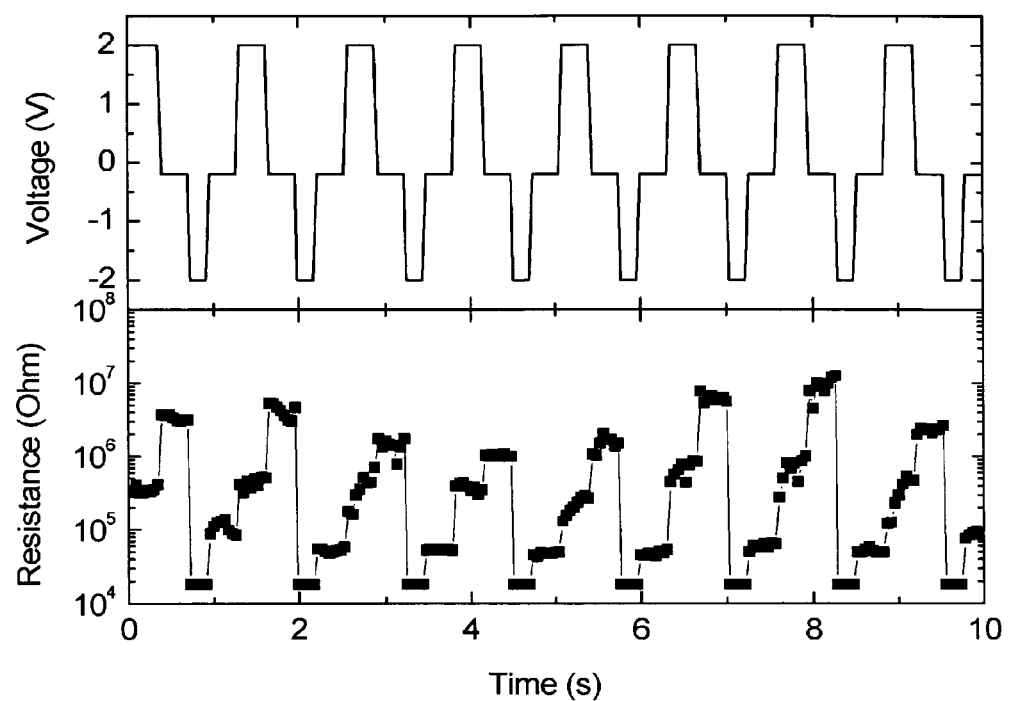

FIG. 5 is a graph showing switching cycles (writing-reading-erasing-reading) of the organic memory device fabricated in Example 1. The threshold voltage determined above was applied alternately in a pulse mode and the reading was repeated to measure the repetitive memory characteristics. The results are shown in FIG. 5. Switching occurred in response to the applied voltage in the respective states. About 100 or more cycles of switching were repeated. In order to clarify the switching characteristics, the results obtained after about 10 cycles of switching are shown in FIG. 5.

Although example embodiments have been disclosed for illustrative purposes, those skilled in the art will appreciate that various modifications and variations are possible, without departing from the scope and spirit of the appended claims. Accordingly, such modifications and variations are intended to come within the scope of the claims. For example, cells of the organic memory device according to example embodiments may further include layers to improve the functions of the memory device.

As apparent from the above description, the organic memory device of example embodiments offers the advantages of possible miniaturization, rapid switching time, decreased operating voltage, decreased fabrication costs and increased reliability over inorganic memory devices. Based on these advantages, the organic memory device of example embodiments may be realized as a light-weight, highly integrated, large-capacity memory device.

In addition, because the organic memory device of example embodiments may be fabricated by a simple and economical process, e.g., spin coating and/or spin casting, and may be processed at a lower temperature, the organic memory device may also be applied to a flexible memory device.

Furthermore, the organic memory device of example embodiments, which uses an iridium organometallic compound, may achieve improved nonvolatile memory characteristics, compared to organic memory devices using conventional electrically conductive polymers.

What is claimed is:

1. A composition comprising a mixture of an electrically conductive polymer and at least one iridium organometallic compound selected from compounds of Formulae 1 to 2:

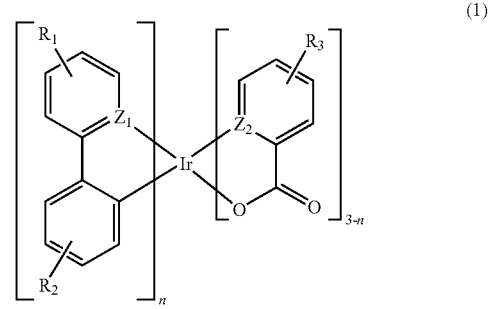

(1)

wherein $R_1$, $R_2$ and $R_3$, which are identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which are identical to or different from each other, are independently O or S, and n is an integer from about 1 to about 2; and

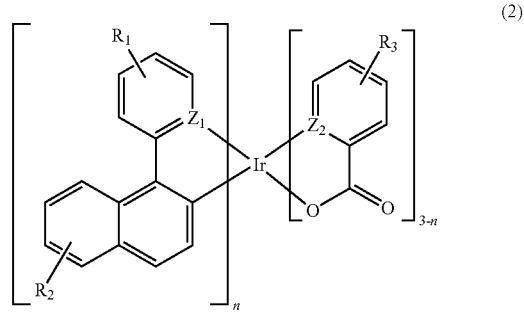

(2)

wherein R₁, R₂ and R₃, which are identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which are identical to or different from each other, are independently O or S, and n is an integer from about 1 to about 2.

2. The composition according to claim 1, wherein the iridium organometallic compound has a maximum emission wavelength of about 450 nm to about 550 nm.

3. The composition according to claim 2, wherein the iridium organometallic compound has a maximum emission wavelength of about 480 nm to about 530 nm.

4. The composition according to claim 1, wherein the electrically conductive polymer is at least one polymer selected from the group consisting of polythiophene, polyacetylene, polyporphyrin, polyvinylcarbazole, polyaniline, polypyrrole, polyphenylenevinylene, polyfluorene, poly(3-hexylthiophene), polynaphthalene, poly(p-phenylene sulfide), polyvinylpyridine, polyferrocene, and polystyrol.

5. An organic active layer comprising the composition according to claim 1.

6. An organic memory device comprising a first electrode, a second electrode and the organic active layer according to claim 5 between the first and second electrodes.

7. The organic memory device according to claim 6, wherein the first or second electrode is made of at least one material selected from the group consisting of gold, silver, platinum, copper, cobalt, nickel, tin, titanium, tungsten, aluminum, and indium tin oxide (ITO).

8. The organic memory device according to claim 6, further comprising:
a barrier layer on the first electrode or under the second electrode.

9. The organic memory device according to claim 8, wherein the barrier is made of an inorganic material selected from the group consisting of silicon oxide, aluminum oxide, niobium oxide, titanium oxide, chromium oxide, vanadium oxide, tantalum oxide, copper oxide, magnesium oxide, tungsten oxide and aluminum nitrate, or an organic material selected from the group consisting of Alq3, polymethylmethacrylate, polystyrene and PET.

10. The organic memory device according to claim 9, wherein the barrier layer is formed of a material selected from the group consisting of $SiO_2$, $Al_2O_3$, $Cu_2O$, $TiO_2$ and $V_2O_3$.

11. A method for fabricating an organic active layer comprising:
forming the organic active layer using a mixture of an electrically conductive polymer and at least one iridium organometallic compound selected from compounds of Formulae 1 to 2:

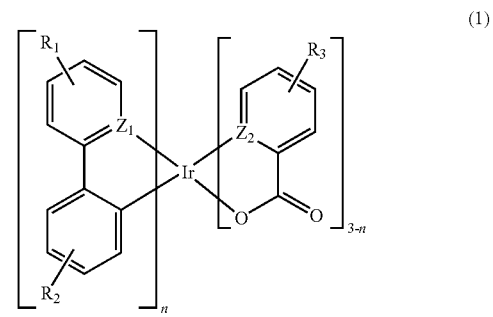

wherein R₁, R₂ and R₃, which are identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which are identical to or different from each other, are independently O or S, and n is an integer from about 1 to about 2; and

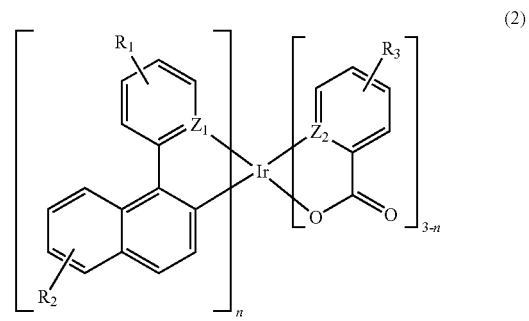

wherein R₁, R₂ and R₃, which are identical to or different from each other, are independently H, a substituted or unsubstituted $C_1$-$C_{20}$ alkyl group, a substituted or unsubstituted $C_1$-$C_{20}$ alkoxy group, a substituted or unsubstituted $C_3$-$C_{20}$ cycloalkyl group, a substituted or unsubstituted $C_3$-$C_{20}$ heterocycloalkyl group, a substituted or unsubstituted $C_6$-$C_{30}$ aryl group, a substituted or unsubstituted $C_4$-$C_{30}$ heteroaryl group, a substituted or unsubstituted $C_7$-$C_{30}$ arylalkyl group, or a substituted or unsubstituted $C_6$-$C_{30}$ aryloxy group, $Z_1$ and $Z_2$, which are identical to or different from each other, are independently O or S, and n is an integer from about 1 to about 2.

12. The method according to claim 11, wherein the iridium organometallic compound has a maximum emission wavelength of about 450 nm to about 530 nm.

13. The method according to claim 12, wherein the iridium organometallic compound has a maximum emission wavelength of about 480 nm to about 500 nm.

14. The method according to claim 11, wherein the electrically conductive polymer is at least one polymer selected from the group consisting of polythiophene, polyacetylene, polyporphyrin, polyvinylcarbazole, polyaniline, polypyrrole, polyphenylenevinylene, polyfluorene, poly(3-hexylthiophene), polynaphthalene, poly(p-phenylene sulfide), polyvinylpyridine, polyferrocene, and polystyrol.

15. The method according to claim 11, wherein the organic active layer is formed using a coating solution of the iridium organometallic compound and the electrically conductive polymer in a solvent by a process selected from spin coating, spray coating, electrostatic coating, dip coating, blade coating, roll coating, and inkjet printing.

16. The method according to claim 15, wherein the solvent is selected from the group consisting of chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, acetonitrile, and mixtures thereof.

17. A method of fabricating an organic memory device comprising:

forming a first electrode and a second electrode; and
forming the organic active layer according to claim 11 between the first and second electrodes.

18. The method according to claim 17, further comprising:
forming a barrier layer on the first electrode or under the second electrode.

19. The method according to claim 18, wherein the barrier layer is made of an inorganic material selected from the group consisting of silicon oxide, aluminum oxide, niobium oxide, titanium oxide, chromium oxide, vanadium oxide, tantalum oxide, copper oxide, magnesium oxide, tungsten oxide and aluminum nitrate, or an organic material selected from the group consisting of Alq3, polymethylmethacrylate, polystyrene and PET.

20. The organic memory device according to claim 19, wherein the barrier layer is formed of a material selected from the group consisting of $SiO_2$, $Al_2O_3$, $Cu_2O$, $TiO_2$ and $V_2O_3$.

* * * * *